(12) United States Patent
Takenaka

(10) Patent No.: US 7,791,707 B2
(45) Date of Patent: Sep. 7, 2010

(54) EXPOSURE APPARATUS, EXPOSURE METHOD, AND DEVICE MANUFACTURING METHOD

(75) Inventor: Tsutomu Takenaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 8 days.

(21) Appl. No.: 12/203,442

(22) Filed: Sep. 3, 2008

(65) Prior Publication Data

US 2009/0066927 A1  Mar. 12, 2009

(30) Foreign Application Priority Data

Sep. 7, 2007  (JP)  ............... 2007-233373

(51) Int. Cl.
*G03B 27/54* (2006.01)
*G03B 27/52* (2006.01)

(52) U.S. Cl. .......................... 355/67; 355/55

(58) Field of Classification Search .............. 355/52, 355/53, 55, 67; 356/399–401; 250/548
See application file for complete search history.

(56) References Cited

U.S. PATENT DOCUMENTS

| | | | |
|---|---|---|---|
| 4,780,615 A | * | 10/1988 | Suzuki ............... 250/548 |
| 4,780,616 A | * | 10/1988 | Nishi et al. ......... 250/548 |
| 6,100,987 A | * | 8/2000 | Kawakubo ............ 356/401 |
| 6,153,886 A | * | 11/2000 | Hagiwara et al. ...... 250/548 |
| 6,509,956 B2 | * | 1/2003 | Kobayashi ............ 355/55 |
| 7,256,870 B2 | | 8/2007 | Finders |

FOREIGN PATENT DOCUMENTS

| | | |
|---|---|---|
| JP | 02-307207 A | 12/1990 |
| JP | 2654418 A | 3/1995 |
| JP | 2006-216949 A | 8/2006 |
| KR | 10-0280431 B | 4/2001 |

* cited by examiner

*Primary Examiner*—Hung Henry Nguyen
(74) *Attorney, Agent, or Firm*—Canon U.S.A., Inc., IP Division

(57) ABSTRACT

An exposure apparatus includes an illumination optical system configured to illuminate an original with exposure light from an exposure light source, a projection optical system configured to project a pattern of the original onto a substrate, and a measuring unit configured to measure a relative position between the original and the substrate via the projection optical system using the exposure light as measurement light. The exposure apparatus exposes the substrate using the exposure light with a plurality of wavelengths or a broadband wavelength upon aligning the original and the substrate based on the measurement result obtained by the measuring unit, and the measuring unit switches a wavelength of the exposure light as the measurement light to a specific wavelength or a narrow-band wavelength in measuring the relative position between the original and the substrate.

15 Claims, 8 Drawing Sheets defocus

Position

EXPOSURE APPARATUS, EXPOSURE METHOD, AND DEVICE MANUFACTURING METHOD

BACKGROUND OF THE INVENTION

1. Field of the Invention

The present invention relates to a technique of exposure with light beams having different wavelengths.

2. Description of the Related Art

An exposure apparatus has conventionally been employed to manufacture semiconductor devices such as an IC and LSI, an image sensing device such as a CCD, a display device such as a liquid crystal panel, and a device such as a magnetic head. This exposure apparatus transfers a pattern image on an original such as a mask or reticle onto a substrate such as a wafer or glass plate via a projection optical system by projection exposure or scanning exposure.

In manufacturing a device having a high packing density using lithography in this way, the circuit pattern of a reticle is transferred onto a wafer, which is coated with a photosensitive agent such as a photoresist, by exposure via the projection optical system.

In recent years, along with a more rapid increase in the packing density of devices such as an IC and LSI, the micropatterning technique for semiconductor wafers is greatly advancing. Examples of a projection exposure apparatus which plays a key role in practicing this micropatterning technique are a reduction projection exposure apparatus (stepper) which exposes a wafer by the step & repeat scheme, and a reduction projection exposure apparatus (scanner) which performs exposure while synchronously scanning a reticle and wafer.

The above-described exposure apparatuses align the relative position between the reticle and the wafer using TTL (Through-The-Lens) measurement. In the TTL measurement, an alignment pattern on the reticle or on an index plate in its vicinity (to be referred to as a reticle-side pattern hereinafter), and an alignment pattern on the wafer or an index plate in its vicinity (to be referred to as a wafer-side pattern hereinafter) are measured via the projection optical system, thereby aligning their relative positions. In this manner, it is a common practice to use exposure light as measurement light in the TTL measurement, which is done via the projection optical system.

The resolution limit of the above-described exposure apparatuses is proportional to the exposure wavelength and inversely proportional to the numerical aperture of the projection optical system. To improve the resolution limit, exposure apparatuses have been developed by shortening the exposure wavelength and increasing the numerical aperture of the projection optical system. However, the depth of focus of the projection optical system is proportional to the exposure wavelength and inversely proportional to the square of the numerical aperture of the projection optical system. Accordingly, as the resolution of the exposure apparatuses increases, the depth of focus rapidly decreases.

The projection exposure apparatus involves the curvature of field of the projection optical system, the curvature of the reticle, the tilt of the reticle, and the tilt of the wafer. This makes it difficult to match the image plane of the projection optical system with the substrate surface. As a finer device pattern is formed to increase the packing density of semiconductor devices, function elements, which have conventionally been formed two-dimensionally, have come to be formed three-dimensionally. Under the circumstance, even an improvement in resolution limit can hardly hold the substrate within the depth of focus of the projection optical system.

To solve the above-described problem, a multiple image forming exposure method is available (e.g., see Japanese Patent No. 2654418). The multiple image forming exposure method transfers the reticle pattern onto the substrate by projection exposure using a plurality of wavelengths or a broadband wavelength (to be referred to as a plurality of wavelengths) as the exposure light. With this operation, the reticle pattern forms images at wavelength-specific positions in the optical axis direction using chromatic aberration, thus increasing the depth of focus.

As described above, the use of a plurality of wavelengths as the exposure light allows increasing the depth of focus by generating chromatic aberration. At the same time, since the TTL measurement generally uses the same wavelengths as those of the exposure light, a plurality of wavelengths are used as the TTL measurement light when a plurality of wavelengths are used as the exposure light, resulting in the generation of chromatic aberration. The generation of chromatic aberration in the TTL measurement gives rise to measurement errors in the optical axis direction and a direction perpendicular it. For example, when on-axis chromatic aberration is generated, a plurality of image forming planes are formed at different positions in the optical axis direction as an image of a reticle-side pattern is formed on the wafer via the projection optical system. This makes it impossible to determine an optimal image forming plane position. It is therefore difficult to specify an optimal position in the optical axis direction, that is, the focus position of the projection optical system, and satisfactorily form an image of the reticle pattern.

When magnification chromatic aberration is generated, a plurality of pattern images are formed in a direction perpendicular to the optical axis as an image of a reticle-side pattern is formed on the wafer via the projection optical system. It is therefore difficult to specify an optimal position in a direction perpendicular to the optical axis. If no optimal position in a direction perpendicular to the optical axis is specified, the overlay accuracy comes under its adverse influence.

As described above, when chromatic aberration is generated using a plurality of wavelengths as the exposure light, chromatic aberration is also generated in the TTL measurement, resulting in erroneous measurement.

SUMMARY OF THE INVENTION

The present invention has been made in consideration of the above-described problem, and has as its object to attain an exposure technique which can satisfactorily align the relative position between a reticle and a wafer while preventing generated chromatic aberration from giving rise to a measurement error in TTL measurement even when a plurality of wavelengths are used as exposure light.

In order to solve the above-described problem and to achieve the above-described object, according to the present invention, there is provided an exposure apparatus comprising an illumination optical system configured to illuminate an original with exposure light from an exposure light source, a projection optical system configured to project a pattern of the original onto a substrate, and a measuring unit configured to measure a relative position between the original and the substrate via the projection optical system using the exposure light as measurement light, wherein the exposure apparatus exposes the substrate using the exposure light with a plurality of wavelengths or a broadband wavelength upon aligning the original and the substrate based on the measurement result obtained by the measuring unit, and wherein the measuring unit switches a wavelength of the exposure light as the measurement light to a specific wavelength or a narrow-band wavelength in measuring the relative position between the original and the substrate.

Also, according to the present invention, there is provided an exposure method for an exposure apparatus which comprises an illumination optical system which illuminates an original with exposure light from an exposure light source, and a projection optical system which projects a pattern of the original onto a substrate, comprising a measuring step of measuring a relative position between the original and the substrate via the projection optical system using the exposure light as measurement light, and an exposing step of exposing the substrate using the exposure light with a plurality of wavelengths or a broadband wavelength upon aligning the original and the substrate based on the measurement result obtained in the measuring step, wherein in the measuring step, a wavelength of the exposure light as the measurement light is switched to a specific wavelength or a narrow-band wavelength in measuring the relative position between the original and the substrate.

According to the present invention, even when a plurality of wavelengths are used as exposure light to increase the depth of focus of an exposure apparatus, it is possible to effectively utilize the effect of increasing the depth of focus by aligning the relative position between a reticle and a wafer with high accuracy while preventing generated chromatic aberration from giving rise to a measurement error in TTL measurement.

Further features of the present invention will become apparent from the following description of exemplary embodiments (with reference to the attached drawings).

DESCRIPTION OF THE EMBODIMENTS

The best modes for carrying out the present invention will be described in detail below with reference to the accompanying drawings.

Embodiments to be described hereinafter are examples for practicing the present invention, and can be appropriately modified or changed in accordance with various conditions and the arrangement of an apparatus to which the present invention is applied. Therefore, the present invention is not particularly limited to the following embodiments.

The object of the present invention can also be achieved by supplying a storage medium which stores software program codes for implementing the functions of the embodiments to be described hereinafter to an exposure apparatus, and reading out and executing the program codes stored in the storage medium by the computer (or CPU or MPU) of the exposure apparatus.

First Embodiment

The first embodiment according to the present invention will be explained first with reference to FIG. 1.

Figure 1:
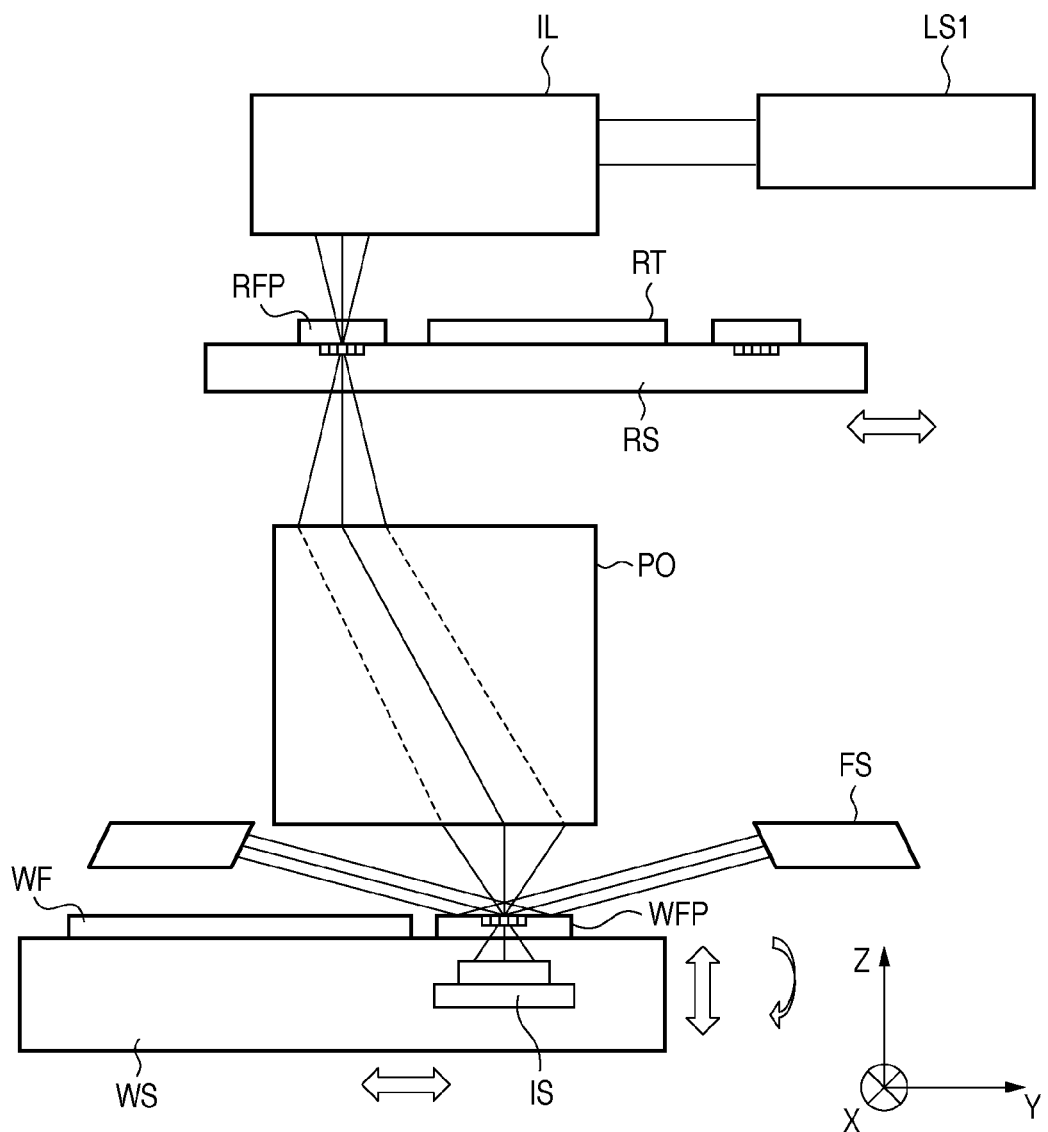
FIG. 1 is a view showing the schematic arrangement of an exposure apparatus according to the first embodiment.

FIG. 1 is a view showing the schematic arrangement of an exposure apparatus according to the first embodiment.

Referring to FIG. 1, exposure light emitted by an exposure light source LS1 enters an exposure illumination optical system IL to form a slit-like or arcuated exposure region, which has a longer side in the X direction, on a reticle (original) RT. The reticle RT and a wafer (substrate) WF are placed at nearly, optically conjugate positions via a projection optical system PO. By driving both a reticle stage RS and wafer stage WS relative to the exposure light optical axis at a speed ratio matching the optical magnification of the projection optical system PO, the transfer pattern of the reticle RT forms an image on the wafer WF (on the substrate) held by the wafer stage WS, thereby transferring the pattern onto the wafer WF by exposure.

The exposure light source LS1 can emit either a single wavelength or a plurality of wavelengths (a plurality of wavelengths or broadband wavelength), or can quickly change its wavelength in emitting a single wavelength.

The arrangement of a scanning exposure apparatus will be explained below.

The reticle RT is held by the reticle stage RS driven in the Y direction of FIG. 1 under the control of a reticle stage laser interferometer and driving control unit (not shown).

An R (reticle)-side reference plate RFP is fixed in a predetermined range on the reticle stage RS as a reticle-side pattern near the reticle RT. The pattern surface of the R-side reference plate RFP is nearly flush with the reflecting surface of the reticle RT.

A plurality of position measurement marks made of a metal such as Cr, Al, or Ta are formed on the reflecting surface of the R-side reference plate RFP.

Figure 2A:
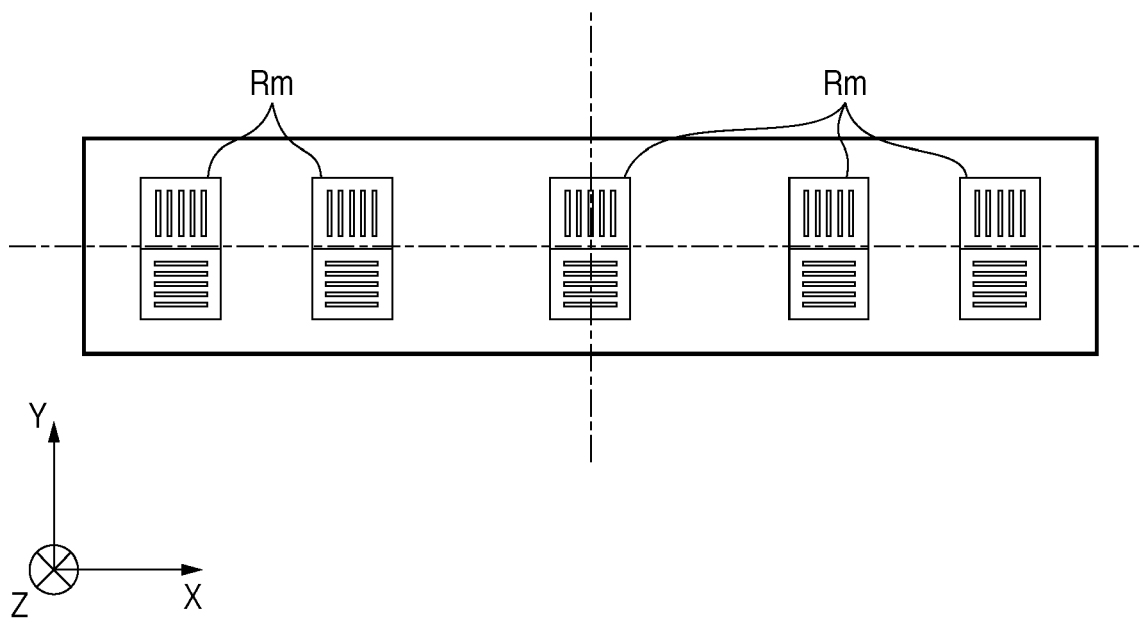
FIG. 2A is a view showing the arrangement of marks on a reticle-side reference plate RFP.
Figure 2B:
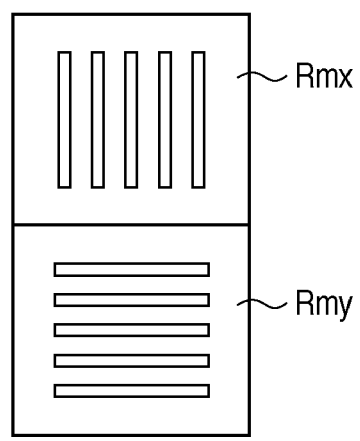
FIG. 2B is a view showing the arrangement of reference marks.

More specifically, a plurality of reticle-side marks Rm are formed on the reference plate RFP to be able to measure a plurality of image heights in the exposure region, as shown in FIG. 2A. An example of the reticle-side mark Rm is a line-and-space pattern having linear openings with a line width close to the exposure resolution on the reticle side, as shown in FIG. 2B. For the sake of convenience, a line pattern running in a direction perpendicular to the X-axis is defined as Rmx, and that running in a direction perpendicular to the Y-axis is defined as Rmy herein. However, the reticle-side mark Rm is not particularly limited to a pattern perpendicular to the X- or Y-axis, and can be a line pattern having a predetermined angle with respect to the X-axis.

Referring to FIG. 1, two reticle-side reference plates RFP are arranged to sandwich the reticle RT in the Y direction as the scanning direction.

The reticle stage RS is driven while its position in the Z direction in FIG. 1 stays constant relative to the projection optical system PO. A moving mirror for reflecting a laser beam from a laser interferometer (not shown) is fixed on the reticle stage RS so that the laser interferometer sequentially measures the position and moving amount of the reticle stage RS.

A wafer-side reference plate WFP is fixed in a predetermined range on the wafer stage WS as a wafer-side pattern near the wafer WF. The surface of the wafer-side reference plate WFP is nearly flush with the upper surface of the wafer WF. A plurality of wafer-side marks Wm made of a metal such as Cr, Al, or Ta are formed on the surface of the wafer-side reference plate WFP.

An example of the wafer-side mark Wm is a line-and-space pattern having linear openings with a line width close to the exposure resolution on the wafer side, as shown in FIG. 2B. For the sake of convenience, a line pattern running in a direction perpendicular to the X-axis is defined as Wmx, and that running in a direction perpendicular to the Y-axis is defined as Wmy herein. However, the wafer-side mark Wm is not particularly limited to a pattern perpendicular to the X- or Y-axis, and can be a line pattern having a predetermined angle with respect to the X-axis. A light amount sensor IS for detecting the amount of light transmitted through the patterns of the wafer-side marks Wm is arranged below the wafer-side marks Wm.

The wafer stage WS includes a driving control unit which can drive it in six axial directions, that is, in the optical axis direction (Z direction) of the projection optical system PO, the directions on a plane (X-Y plane) perpendicular to the optical axis direction, the rotation direction (θ direction) about the optical axis, and the directions along which the tilt adjustment is performed with respect to the image plane.

A moving mirror for reflecting a laser beam from a wafer stage laser interferometer (not shown) is fixed on the wafer stage WS so that the laser interferometer sequentially measures the position and moving amount of the wafer stage WS.

To perform TTL measurement in this embodiment, the reticle-side marks Rm are illuminated by the exposure illumination optical system IL to form images of the light transmitted through the marks Rm on the wafer-side marks Wm via the projection optical system PO. The amount of light transmitted through the marks Wm is detected by the light amount sensor IS.

TTL measurement using a single wavelength will be explained.

Figure 3:
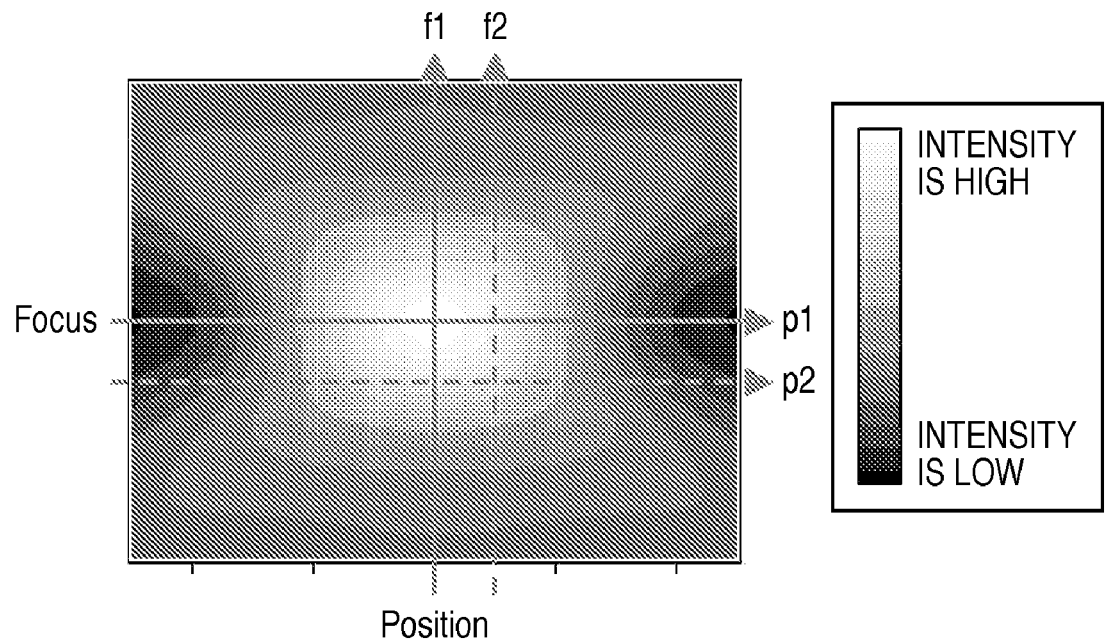
FIG. 3 is a chart showing the intensity distribution taken along the Z-X section when a single wavelength is used.

FIG. 3 shows the image intensity distribution taken along the Z-X section, which is obtained by calculating the intensity distribution when an ideal projection optical system PO free from any aberration is used.

Focus measurement using a focus sensor FS will be explained first.

First, the reticle stage RS is driven so that the reticle-side marks Rm on the reticle-side reference plate RFP are set at a predetermined image height in the exposure region.

Figure 4:
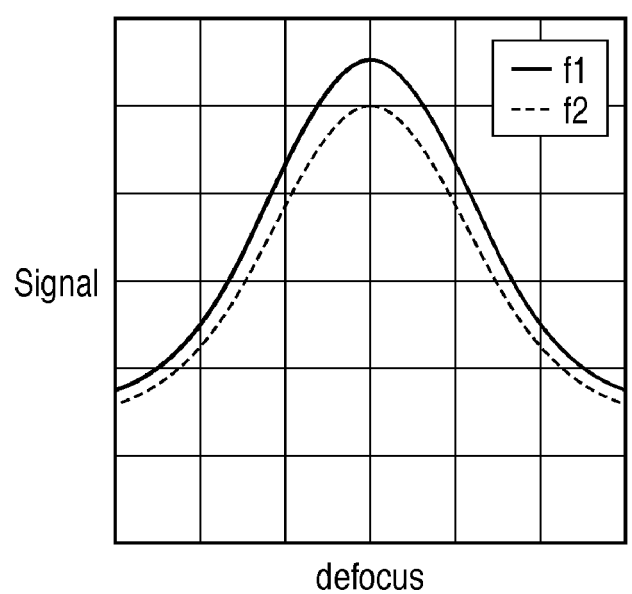
FIG. 4 is a graph illustrating a focus waveform signal when a single wavelength is used.

Next, the wafer stage WS is driven so that the wafer-side marks Wm on the wafer-side reference plate WFP are set near the position of an image on the reticle-side marks Rm on the reticle-side reference plate RFP. The amount of light transmitted through the wafer-side reference plate WFP is detected while driving the wafer stage WS in the optical axis direction of the projection lens. For example, when the measurement is performed as indicated by an arrow f1 in FIG. 3, a measurement waveform as indicated by f1 in FIG. 4 (a sectional view taken along the arrow f1 in FIG. 3) can be obtained. By detecting the position at which the light amount is maximum, a best image forming position of the projection lens at an image height corresponding to this position can be calculated. The arrow f1 indicates focus measurement at an optimal position in the position direction. However, even when focus measurement is performed at a position slightly shifted from the optical axis direction in the position direction, the measurement value is less likely to come under its adverse influence, as indicated by an arrow f2 (a waveform f2 in FIG. 4).

Position measurement (in the X and Y directions of FIG. 1) will be exemplified next.

As in the focus measurement, the reticle stage RS is driven so that the reticle-side marks Rm on the reticle-side reference plate RFP are set at a predetermined image height in the exposure region.

Figure 5:
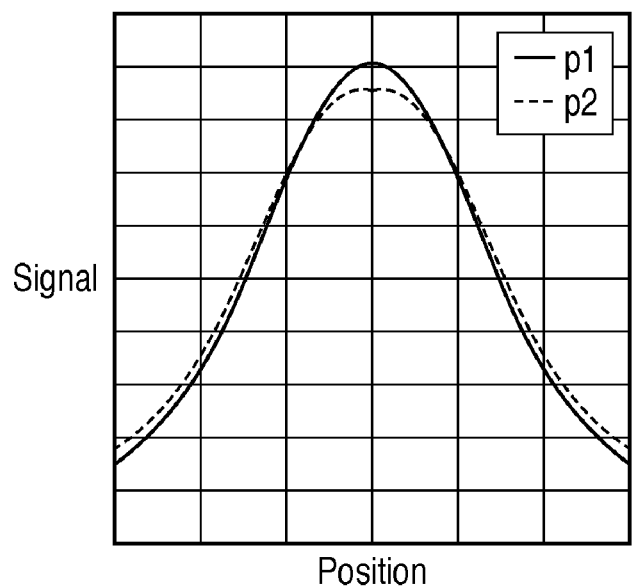
FIG. 5 is a graph illustrating a position waveform signal when a single wavelength is used.

The wafer stage WS is driven so that the wafer-side marks Wm on the wafer-side reference plate WFP are set near the position of an image on the reticle-side marks Rm on the reticle-side reference plate RFP. The amount of light transmitted through the wafer-side reference plate WFP is detected while driving the wafer stage WS in a direction perpendicular to the optical axis of the projection lens. For example, when the measurement is performed as indicated by an arrow p1 in FIG. 3, a measurement waveform as indicated by p1 in FIG. 5 can be obtained. By detecting the position at which the light amount is maximum, a best image forming position of the projection lens at an image height corresponding to this position can be calculated. The arrow p1 indicates position measurement at an optimal position in the focus direction. However, even when position measurement is performed at a position slightly shifted from the optical axis direction in the focus direction, the measurement value is less likely to come under its adverse influence, as indicated by an arrow p2 (a waveform p2 in FIG. 5).

In the position measurement, the position of the wafer stage WS in the X direction is calculated by the line pattern Wmx when the wafer stage WS is driven in, for example, the X direction of FIG. 1, while the position of the wafer stage WS in the Y direction is calculated by the line pattern Wmy when the wafer stage WS is driven in, for example, the Y direction of FIG. 1. Measurement in at least two directions allows alignment on a plane perpendicular to the optical axis of the projection lens. However, the line directions of the wafer-side patterns, and the driving direction of the wafer stage WS are not particularly limited to those described above. Alignment on a plane perpendicular to the optical axis of the projection lens can be done in accordance with arbitrary two or more wafer-side patterns and the measurement values obtained by driving the wafer stage WS in arbitrary two or more directions.

TTL measurement using a plurality of wavelengths as a feature of the present invention will be explained.

Figure 6:
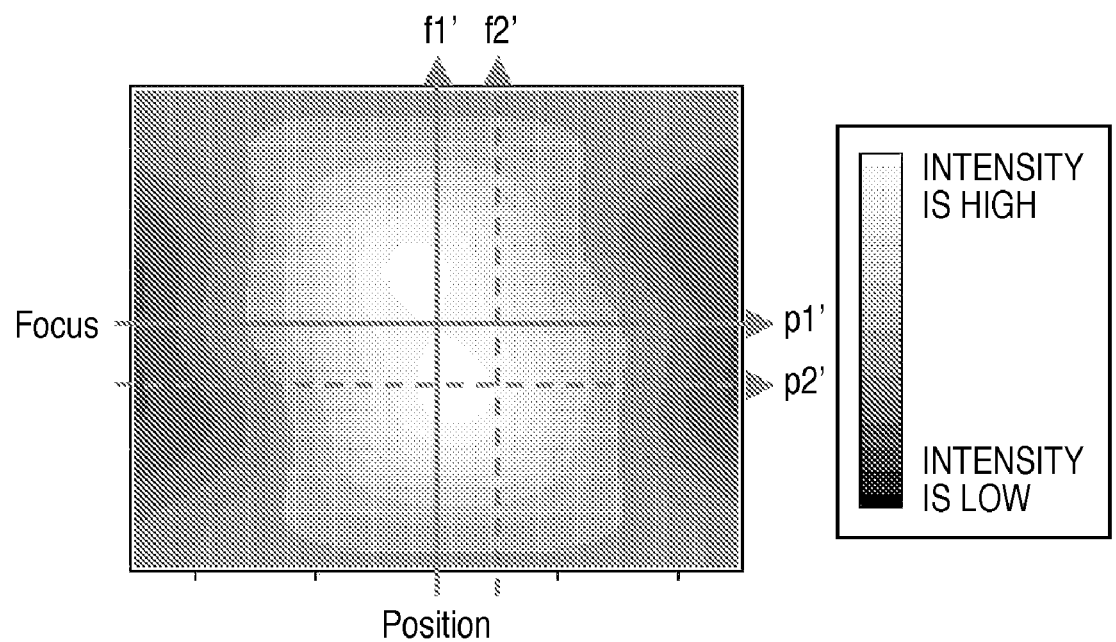
FIG. 6 is a chart showing the intensity distribution taken along the Z-X section when a plurality of wavelengths are used.

FIG. 6 shows the intensity distribution taken along the Z-X section when a lens is simultaneously irradiated with exposure light with two wavelengths.

This intensity distribution is the one calculated for an ideal lens free from any aberration. In two-wavelength exposure, the image forming position, that is, the highest intensity position at which the light intensity is highest changes for each wavelength due to chromatic aberration. A light intensity distribution generated by two wavelengths has two intensity peaks at different positions in the focus and position directions. Hence, an intensity distribution is formed to have an angle corresponding to the chromatic aberration amount with respect to the optical axis.

Focus measurement and position measurement when an intensity distribution as shown in FIG. 6 is obtained will be explained.

In focus measurement, the position at which the transmitted light amount is a maximum is calculated. The transmitted amount of light is obtained by driving in the focus direction the wafer stage WS along nearly the center of the intensity distribution shown in FIG. 6 in the position direction. However, it is difficult to precisely calculate the central position in the position direction in advance. It is also difficult to control the wafer stage and reticle stage without generating any error during focus measurement. This makes it practically impossible to perform focus measurement at exactly the central position in the position direction, so the intensity distribution cannot be free from an error in the position direction for each focus measurement.

Figure 7:
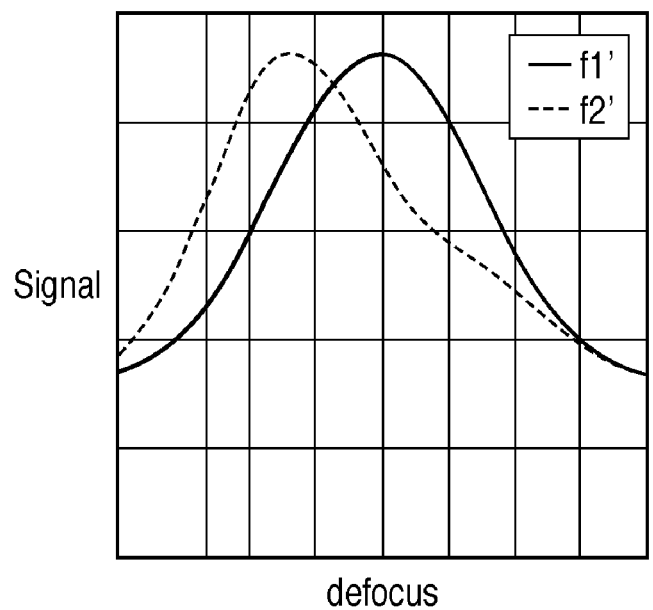
FIG. 7 is a graph illustrating a focus waveform signal when a plurality of wavelengths are used.

Assume that a light intensity distribution having an angle with respect to the optical axis, as shown in FIG. 6, is formed. In this case, when the intensity distribution has an error in the position direction, the position at which the maximum amount of light is obtained shifts from an optimal position during focus measurement. For example, if focus measurement is performed at an optimal position in the position direction, that is, the measurement is performed along an arrow f1' in FIG. 6, a measurement waveform as indicated by f1' in FIG. 7 is obtained. On the other hand, if focus measurement is performed while that position is slightly shifted from an optimal position in the position direction, that is, the measurement is performed along an arrow f2' in FIG. 6, a measurement waveform as indicated by f2' in FIG. 7 is obtained. As is obvious from these measurement results, the waveforms f1' and f2' exhibit different positions at which the intensity is a maximum. Different focus values are thus measured, resulting in the generation of a measurement error.

In position measurement, the position at which the transmitted amount of light is a maximum is calculated. The transmitted amount of light is obtained by driving in the position direction the wafer stage WS along nearly the center of the intensity distribution shown in FIG. 6 in the focus direction. However, it is difficult to precisely calculate the central position in the focus direction in advance. It is also difficult to control the wafer stage and reticle stage without generating any error during position measurement. This makes it practically impossible to perform focus measurement at exactly the central position in the focus direction, so the intensity distribution cannot be free from an error in the focus direction for each focus measurement.

Figure 8:
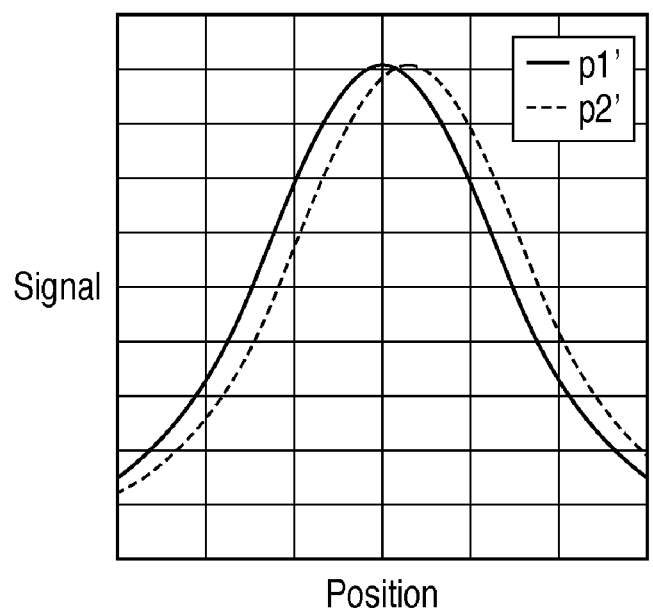
FIG. 8 is a graph illustrating a position waveform signal when a plurality of wavelengths are used.

Assume that a light intensity distribution having an angle with respect to the optical axis, as shown in FIG. 6, is formed. In this case, when the intensity distribution has an error in the focus direction, the position at which the maximum amount of light is obtained shifts from an optimal position during position measurement. This shift amount gives rise to a position error. This is obvious from the relationship between the arrows p1' and p2' in FIG. 6 and that between the waveforms p1' and p2' in FIG. 8, which indicate the sections taken along these arrows.

Although the above-described focus measurement and position measurement use the arrows f1', f2', p1', and p2' for the sake of convenience, the interval between the arrows f1' and f2' and that between the arrows p1' and p2' are not particularly limited to those exemplified above. That is, as long as there is an interval more or less, a measurement error is generated accordingly.

As described above, focus measurement and position measurement in two-wavelength exposure generates a measurement error due to chromatic aberration. This applies not only to two-wavelength exposure but also to plural-wavelength exposure. To suppress this measurement error, switching to a single-wavelength mode is performed in TTL measurement even in plural-wavelength exposure in this embodiment.

The object of plural-wavelength exposure is to increase the depth of focus in printing a transfer pattern, as described above. To effectively utilize the increased depth of focus, the central position is desirably measured by TTL measurement. The depth of focus is defined by the shortest (minimal) exposure wavelength and longest (maximal) exposure wavelength. In view of this, the central position is desirably measured using the center wavelength (median wavelength) between the shortest wavelength and the longest wavelength. Using a single wavelength, that is, the center wavelength alone as the measurement wavelength allows TTL measurement with high accuracy free from any influence of the intensity distribution in plural-wavelength exposure, as shown in FIG. 6, and allows measurement of the central position in plural-wavelength exposure. By calculating in advance the relationship between this TTL measurement result and an optimal image forming position, and correcting the measurement result, the accuracy of the TTL measurement can be further improved.

Although this embodiment has been explained assuming an exposure apparatus which can simultaneously emit exposure light with a plurality of wavelengths, the present invention is not particularly limited to this. For example, the present invention becomes effective even for an exposure apparatus, which increases the depth of focus by quickly changing the emission wavelength, by TTL measurement using the center wavelength between the shortest wavelength and longest wavelength of the emitted exposure light.

Although this embodiment has exemplified TTL measurement using the center wavelength between the shortest wavelength and the longest wavelength, the present invention is not particularly limited to this. For example, by calculating in advance a correlation between the result of TTL measurement using an arbitrary single wavelength and the result of exposure using a plurality of wavelengths, an optimal image forming position can be calculated based on the TTL measurement result.

Although this embodiment has exemplified TTL measurement using one single wavelength, the present invention is not particularly limited to this. For example, TTL measurement may be sequentially performed using two single wavelengths, that is, the shortest wavelength and longest wavelength of a plurality of wavelengths used for exposure, thereby calculating the measurement values. Even in this case, by calculating in advance a correlation with the result of exposure using a plurality of wavelengths, an optimal image forming position can be calculated based on the TTL measurement result. It is also effective to sequentially perform TTL measurement not only using two wavelengths, that is, the shortest wavelength and longest wavelength but also using a plurality of arbitrary single wavelengths.

The exposure light source LS1 is not particularly limited to one device. The exposure light source LS1 also includes a plurality of irradiation devices which emit beams of exposure light with a plurality of single wavelengths, and synthesize them into one light beam.

As described above, when chromatic aberration is generated using a plurality of wavelengths or broadband wavelength as exposure light to increase the depth of focus of the exposure apparatus, the generated chromatic aberration gives rise to a measurement error in TTL measurement. To suppress chromatic aberration in TTL measurement such as that generated in exposure, exposure is performed using a plurality of wavelengths, and TTL measurement is performed using a single wavelength in this embodiment. This allows satisfactory TTL measurement without generating any chromatic aberration because a single wavelength is used in the TTL measurement.

The above-described expression "single wavelength" is used for the sake of convenience, so apparently even a light source such as a laser has a finite spectral width. In this specification, a single wavelength has a narrow-band wavelength range that does not generate a measurement error in TTL measurement.

Second Embodiment

Two-wavelength exposure will be explained next as the second embodiment.

The same reference numerals as in the first embodiment denote the same constituent elements in the second embodiment, and a description thereof will not be given.

Figure 9:
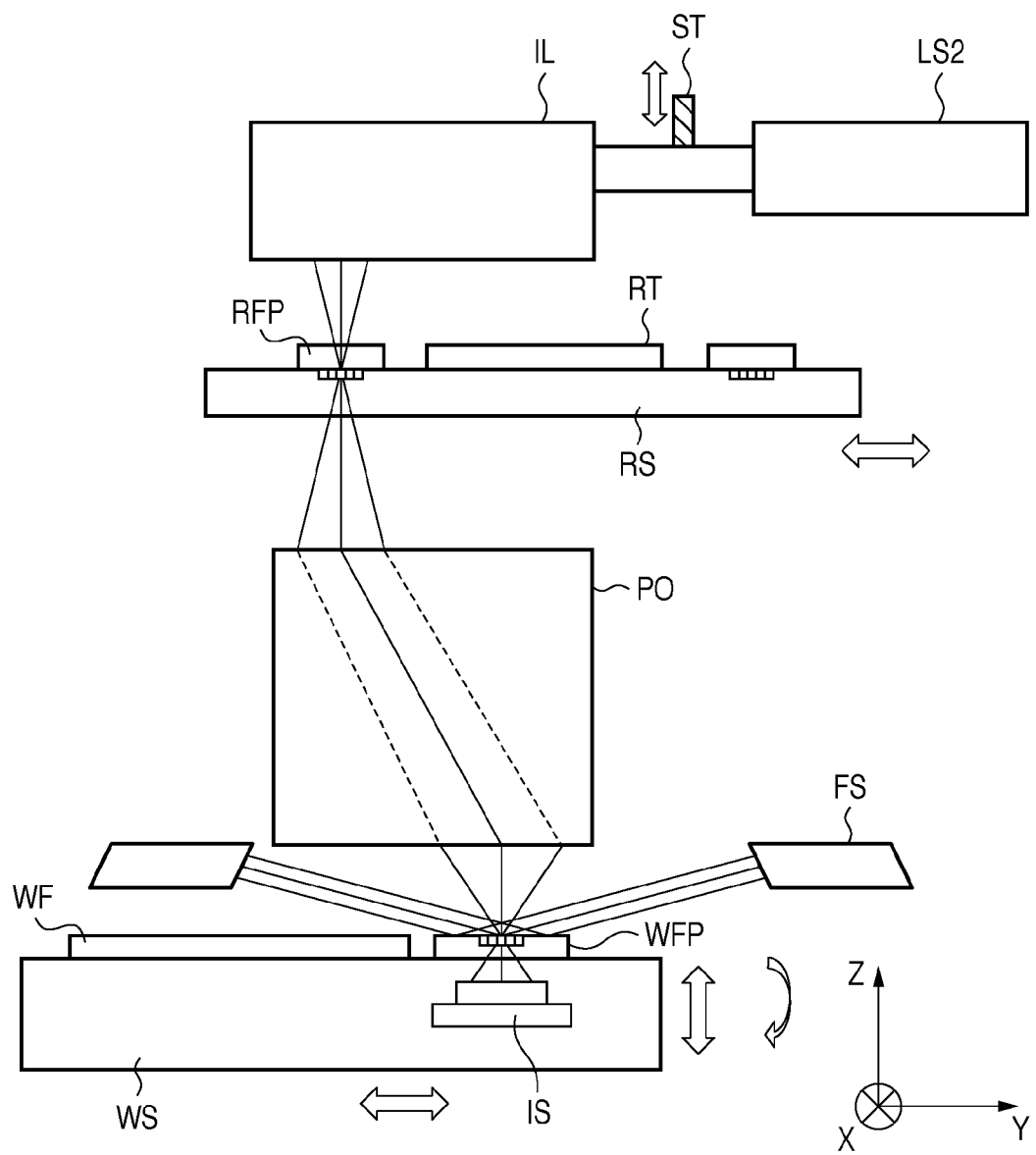
FIG. 9 is a view showing the schematic arrangement of an exposure apparatus according to the second embodiment.

FIG. 9 is a view showing the schematic arrangement of an exposure apparatus according to the second embodiment.

Referring to FIG. 9, a light source LS2 is a device which emits a light beam having an arbitrary size. An almost half region of the section of the light beam corresponds to the short exposure wavelength, and the remaining half region corresponds to the long exposure wavelength. The light beam components of the two wavelengths divided into these two regions uniformly mix via an illumination optical system IL to form a slit-like or arcuated exposure region, which has a longer side in the X direction, on a reticle RT.

In this embodiment, a shutter ST for shielding an arbitrary region of the light beam emitted by the light source LS2 is additionally provided. The shutter ST has a structure which moves, for example, a light-shielding plate from a retreat position outside the optical path to a predetermined position on the optical path. However, the present invention is not particularly limited to this, and the shutter ST need only have a structure, which prevents a certain component of the light beam emitted by the light source LS2 from entering the illumination optical system IL, such as a structure which drives a reflecting mirror.

In this embodiment, to make a shift from two-wavelength exposure to TTL measurement, the wavelength of the light source LS2 itself need not be changed. Instead, TTL measurement becomes ready as in the case using a single wavelength by shielding regions, which emit light beams with wavelengths other than the wavelength of measurement light, by the shutter ST. Hence, a shift to TTL measurement can be made in a short period of time because no time is required to change the wavelength of the light source LS2, and it is only necessary to take account of the driving time of the shutter ST alone. A shift from TTL measurement to two-wavelength exposure can also be made in a short period of time because it is only necessary to drive the shutter ST to the retreat position.

TTL measurement using a single wavelength need only be performed even in two-wavelength exposure by performing TTL measurement using one of the short-wavelength exposure light and long-wavelength exposure light, and calculating in advance the relationship between the measurement result and an optimal image forming position in two-wavelength exposure. However, the present invention is not particularly limited to this. After TTL measurement is performed using one wavelength (e.g., the short-wavelength exposure light), it may be performed again by driving the shutter ST so that the other wavelength (e.g., the long-wavelength exposure light) alone is emitted. In this case, an optimal image forming position in two-wavelength exposure can be calculated based on the measurement results obtained by using the short wavelength and long wavelength. By calculating in advance the relationship between the measurement results obtained by using the respective wavelengths and an optimal image forming position in two-wavelength exposure, and correcting the measurement result, the accuracy of the TTL measurement can be further improved.

Although this embodiment has exemplified two-wavelength exposure, the present invention is also effective for exposure using three or more wavelengths. In plural-wavelength exposure, an optical element, in which the light source LS2 emits exposure light divided into a plurality of regions which exhibit respective wavelengths, and the shutter ST transmits an arbitrary exposure wavelength alone in TTL measurement, need only be used. In this case, it is also effective to sequentially perform TTL measurement using a plurality of arbitrary single wavelengths.

Although the shutter ST is provided independently of the light source LS2 and illumination optical system IL in this embodiment, the present invention is not particularly limited to this. The shutter ST may be built in the light source LS2 or illumination optical system IL.

The light source LS2 is not particularly limited to one device. The light source LS2 also includes a plurality of irradiation devices which emit beams of exposure light with a plurality of wavelengths, and synthesize them into one light beam.

Third Embodiment

The third embodiment will be explained next with reference to FIG. 10.

The same reference numerals as in the first and second embodiments and FIGS. 1 and 9 denote the same constituent elements in the third embodiment, and a description thereof will not be given.

Figure 10:
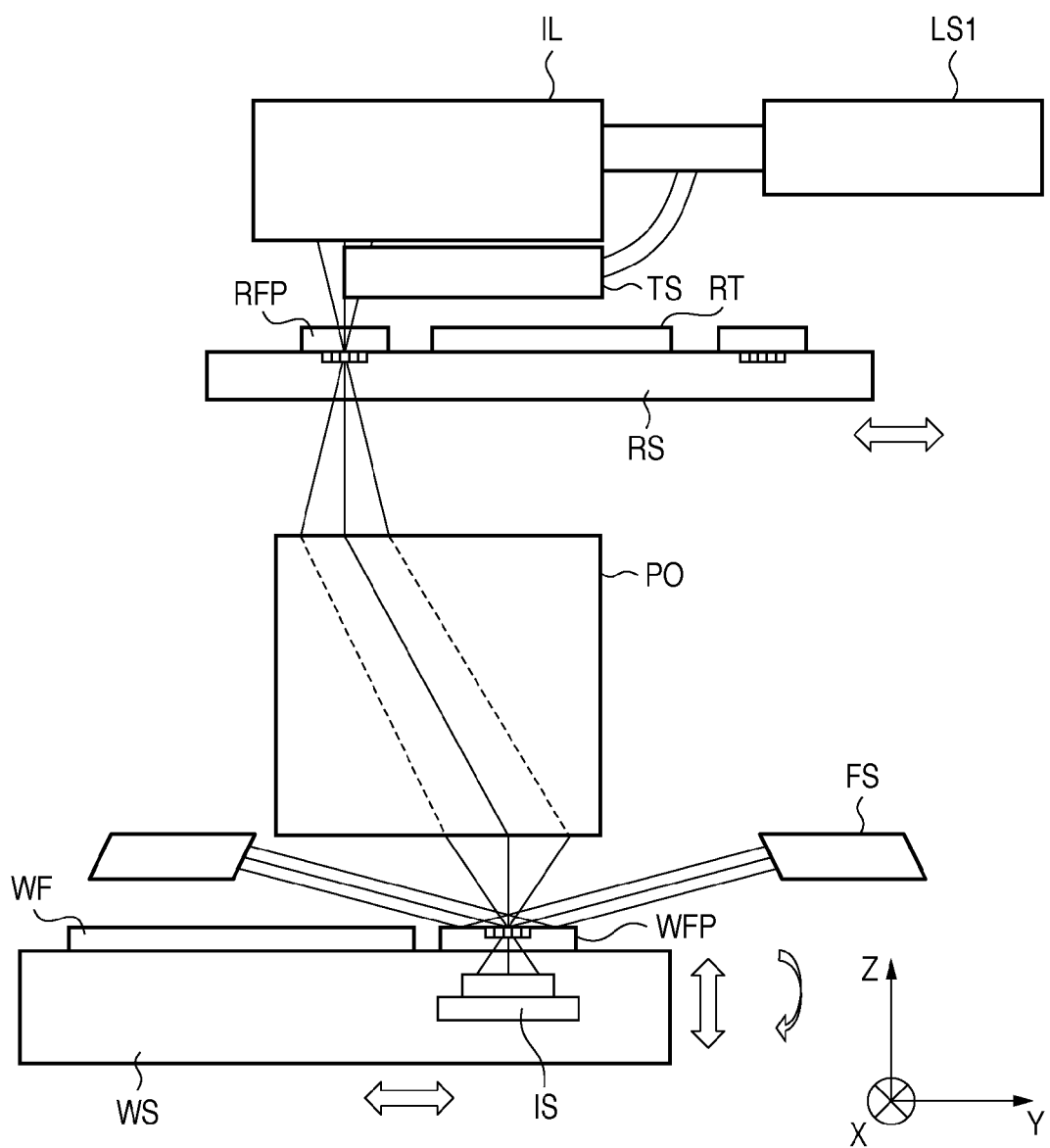
FIG. 10 is a view showing the schematic arrangement of an exposure apparatus according to the third embodiment.

The third embodiment has a feature in that a TTL measuring system includes a TTL scope TS, as shown in FIG. 10. The TTL scope TS is a microscope to observe a reticle RT. The object point of the TTL scope TS lies on a reticle-side reference plate RFP (may lie on the reticle RT), and its image point lies on an image sensing element in it. An example of the image sensing element is a CCD. An object point also lies on a wafer-side reference plate WFP (may lie on a wafer WF) via a projection optical system PO. Driving a reticle stage RS and wafer stage WS makes it possible to observe an arbitrary position on each stage. An illumination system has a structure in which light extended from an exposure laser IL illuminates the object via an objective lens from the TTL scope TS.

TTL measurement is performed by illuminating the reticle-side reference plate RFP with measurement light which is also be used as exposure light, and illuminating the wafer-side reference plate WFP with it via the projection optical system PO. The light reflected by reference marks Rm and Wm on the respective reference plates is observed by an image sensing system in the TTL scope TS. In measurement in the focus direction, the focus position of the TTL scope TS is matched with the reference mark Rm on the reticle-side reference plate RFP.

The wafer-side reference plate WFP is driven in the focus direction while the focus position of the TTL scope TS and the position of the reticle-side reference plate RFP in the focus direction are fixed, thereby aligning the wafer-side reference plate WFP with the position at which the contrast is a maximum. This allows relative position alignment, that is, focus positioning between the reticle-side reference plate RFP and the wafer-side reference plate WFP.

Position measurement is performed by aligning the reticle-side reference plate RFP and the wafer-side reference plate WFP in the focus direction, and then measuring the relative position, in the position direction, between the reference marks Rm and Wm on the respective reference plates RFP and WFP.

When the TTL measurement light has a single wavelength, the above-described measurement allows satisfactory focus measurement and position measurement. However, when the exposure light has two wavelengths, the TTL measurement light also has the two wavelengths. This generates on-axis chromatic aberration and magnification chromatic aberration, which decreases the contrast between the observed reference marks Rm and reference marks Wm on the reticle-side reference plate RFP and wafer-side reference plate WFP, respectively. As the contrast decreases, measurement at an optimal position becomes impossible in focus measurement, resulting in an error. Also, in position measurement, it becomes difficult to specify the positions of the observed reference marks Rm and Wm on the reticle-side reference plate RFP and wafer-side reference plate WFP, respectively, resulting in an error.

A feature of this embodiment is in that the TTL measurement light has a single wavelength to solve the above-described problem.

The object of plural-wavelength exposure is to increase the depth of focus in printing a transfer pattern, as described above. To effectively utilize the increased depth of focus, the central position is desirably measured by TTL measurement. The depth of focus is determined by the shortest exposure wavelength and longest exposure wavelength. In view of this, the central position is desirably measured using the median wavelength (center wavelength) between the shortest wavelength and the longest wavelength. Using a single wavelength, that is, the center wavelength alone as the measurement wavelength allows TTL measurement with high accuracy as in the normal case using a single wavelength, and allows measurement of the central position in plural-wavelength exposure. By calculating in advance the relationship between this TTL measurement result and an optimal image forming position, and correcting the measurement result, the accuracy of the TTL measurement can be further improved.

Although this embodiment has been explained assuming an apparatus which can simultaneously emit exposure light with a plurality of wavelengths, the present invention is not particularly limited to this. For example, the present invention becomes effective even for an exposure apparatus, which increases the depth of focus by quickly changing the emission wavelength, by TTL measurement using the center wavelength between the shortest wavelength and longest wavelength of the emitted exposure light.

Although this embodiment has exemplified TTL measurement using the center wavelength between the shortest wavelength and the longest wavelength, the present invention is not particularly limited to this. For example, by calculating in advance a correlation between the result of TTL measurement using an arbitrary single wavelength and the result of exposing a device using a plurality of wavelengths, an optimal image forming position can be calculated based on the TTL measurement result.

Although this embodiment has exemplified TTL measurement using one single wavelength, the present invention is not particularly limited to this. For example, TTL measurement may be sequentially performed using two single wavelengths, that is, the shortest wavelength and longest wavelength of a plurality of wavelengths used for exposure, thereby calculating the measurement values. Even in this case, by calculating in advance a correlation with the result of exposure with a plurality of wavelengths, an optimal image forming position can be calculated based on the TTL measurement result. It is also effective to sequentially perform TTL measurement not only using two wavelengths, that is, the shortest wavelength and longest wavelength but also using a plurality of arbitrary single wavelengths.

An exposure light source LS1 is not particularly limited to one device. The exposure light source LS1 also includes a plurality of irradiation devices which emit beams of exposure light with a plurality of single wavelengths, and synthesize them into one light beam.

Fourth Embodiment

Figure 11:
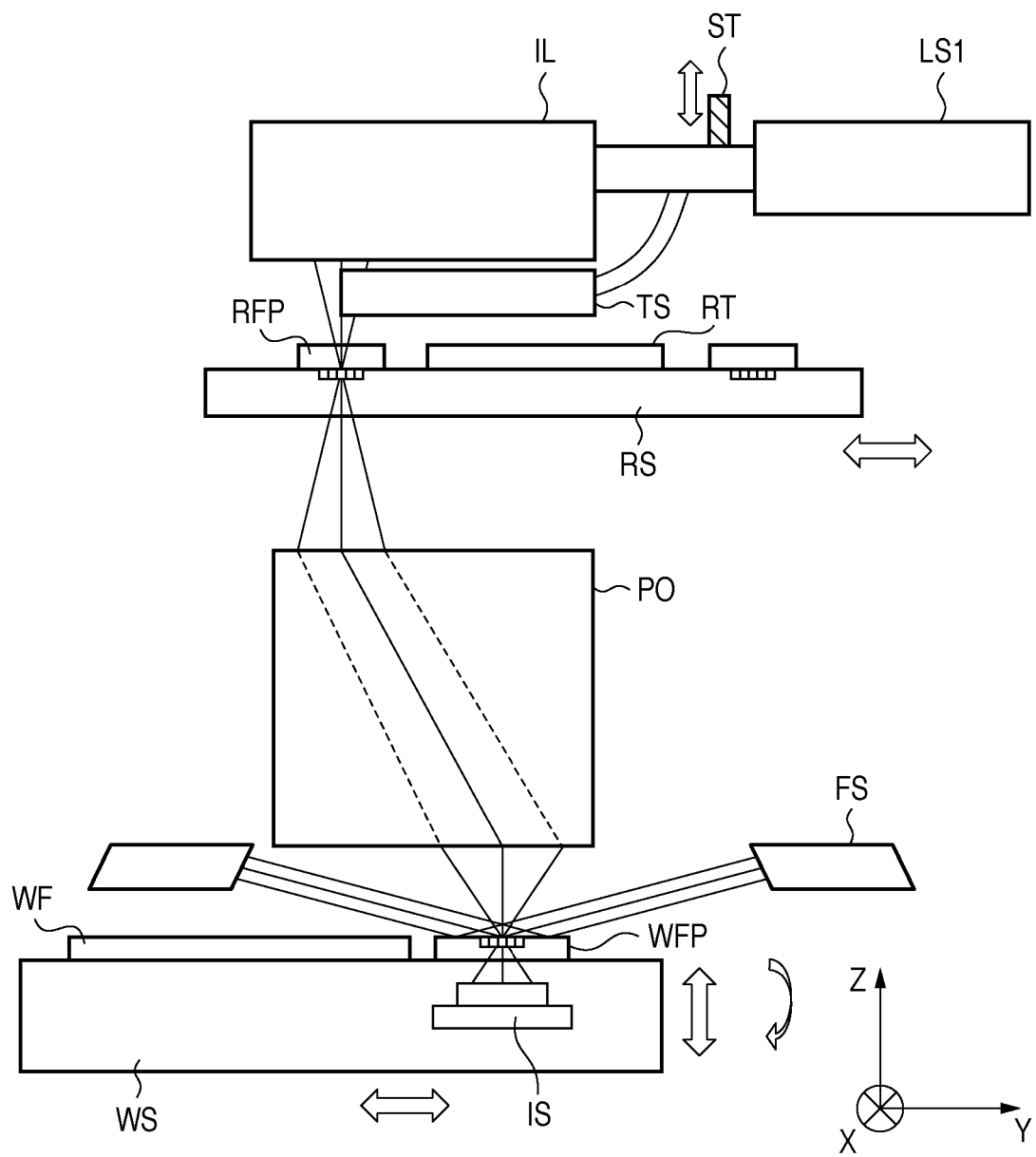
FIG. 11 is a view showing the schematic arrangement of an exposure apparatus according to the fourth embodiment.

The fourth embodiment will be explained next with reference to FIG. 11.

The same reference numerals as in the first to third embodiments and FIGS. 1 to 3, 9, and 10 denote the same constituent elements in the fourth embodiment, and a description thereof will not be given.

A feature of this embodiment is in that a TTL measuring system includes a TTL scope TS, light source LS2, and shutter ST.

In this embodiment, to make a shift from two-wavelength exposure to TTL measurement, the wavelength of the light source LS2 itself need not be changed. Instead, TTL measurement becomes ready as in the case using a single wavelength by shielding only a region, which emits one of the two wavelengths, by the shutter ST. Hence, a shift to TTL measurement can be made in a short period of time because no time is required to change the wavelength of the light source LS2, and it is only necessary to take account of the driving time of the shutter ST alone. A shift from TTL measurement to two-wavelength exposure can also be made in a short period of time because it is only necessary to drive the shutter ST to the retreat position.

TTL measurement using a single wavelength need only be performed even in two-wavelength exposure by performing TTL measurement using one of the short-wavelength exposure light and long-wavelength exposure light, and calculating in advance the relationship between the measurement result and an optimal image forming position in two-wavelength exposure. However, the present invention is not particularly limited to this. After TTL measurement is performed using one wavelength, it may be performed again by driving the shutter ST so that the other wavelength alone is emitted. In this case, an optimal image forming position in two-wavelength exposure can be calculated based on the measurement results obtained by using the short wavelength and long wavelength. By calculating in advance the relationship between the measurement results obtained by using the respective wavelengths and an optimal image forming position in two-wavelength exposure, and correcting the measurement, the accuracy of the TTL measurement can be further improved.

Although this embodiment has exemplified two-wavelength exposure, the present invention is also effective for exposure using three or more wavelengths. In plural-wavelength exposure, the light source LS2 need only emit exposure light divided into a plurality of regions which exhibit respective wavelengths, and the shutter ST need only transmit an arbitrary exposure wavelength alone in TTL measurement. In this case, it is also effective to sequentially perform TTL measurement using a plurality of arbitrary single wavelengths.

Although the shutter ST is provided independently of the light source LS2 and illumination optical system IL in this embodiment, the present invention is not particularly limited to this. The shutter ST may be built in, for example, the light source LS2, illumination optical system IL, or TTL scope TS.

The light source LS2 is not particularly limited to one device. The light source LS2 also includes a plurality of irradiation devices which emit beams of exposure light with a plurality of wavelengths, and synthesize them into one light beam.

Although the first to third embodiments have exemplified a case in which TTL measurement is performed by switching from a plural-wavelength mode to a single-wavelength mode, the present invention is not limited to this. For example, it is effective to switch from a plural-wavelength mode to a single-wavelength mode by providing an implement which can insert and retract a wavelength filter into and from, for example, a laser beam source, optical path, or illumination optical system.

[Device Manufacturing Method]

A process of manufacturing a semiconductor device using the exposure apparatus according to each of the above-described embodiments will be explained next.

Devices (e.g., a semiconductor device and liquid crystal display device) are manufactured by an exposing step of exposing a substrate using the exposure apparatus according to each of the above-described embodiments, a developing step of developing the substrate exposed in the exposing step, and other known steps of processing the substrate developed in the developing step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-233373, filed Sep. 7, 2007, which is hereby incorporated by reference herein in its entirety.

What is claimed is:

1. An exposure apparatus comprising:
    an illumination optical system configured to illuminate an original with exposure light from an exposure light source;
    a projection optical system configured to project a pattern of the original onto a substrate; and
    a measuring unit configured to measure a relative position between the original and the substrate via the projection optical system using the exposure light as measurement light,
    wherein the exposure light source can simultaneously emit a plurality of wavelengths,
    wherein the exposure apparatus exposes the substrate using the simultaneously emitted exposure light with the plurality of wavelengths upon aligning the original and the substrate based on the measurement result obtained by the measuring unit, and
    wherein the measuring unit measures the relative position between the original and the substrate using the measurement light with a single wavelength which is emitted from the exposure light source.

2. The apparatus according to claim 1, wherein the measuring unit measures the relative position between the original and the substrate based on a correlation between an image of the pattern projected by the projection optical system using the measurement light, and an image of the pattern projected by the projection optical system using the exposure light.

3. The apparatus according to claim 1, wherein the measuring unit sets the measurement light by switching to light having a median wavelength between a shortest wavelength and a longest wavelength of wavelengths used for the exposure light.

4. The apparatus according to claim 1, wherein the measuring unit sets the measurement light by switching to light having a shortest wavelength or a longest wavelength of wavelengths used for the exposure light.

5. The apparatus according to claim 1, wherein the measuring unit measures, while switching a wavelength of the measurement light, the relative position between the original and the substrate using each wavelength of the measurement light.

6. The apparatus according to claim 1, wherein the measuring unit comprises an optical element which transmits only light having the wavelength used for the exposure light, and switches from the wavelength of the exposure light to the wavelength of the measurement light using said optical element.

7. The apparatus according to claim 1, wherein the measuring unit comprises an element which shields light having a wavelength other than the wavelength of the measurement light, and switches from the wavelength of the exposure light to the wavelength of the measurement light using said element.

8. An exposure method for an exposure apparatus comprising an illumination optical system configured to illuminate an original with exposure light from an exposure light source capable of simultaneously emitting a plurality of wavelengths, and a projection optical system configured to project a pattern of the original onto a substrate, the method comprising:
    a measuring step of measuring a relative position between the original and the substrate via the projection optical system using the exposure light as measurement light; and
    an exposing step of exposing the substrate using the simultaneously emitted exposure light with the plurality of wavelengths upon aligning the original and the substrate based on the measurement result obtained in the measuring step,
    wherein the measuring step comprises measuring the relative position between the original and the substrate using the measurement light with a single wavelength which is emitted from the exposure light source.

9. The method according to claim 8, wherein in the measuring step, the relative position between the original and the substrate is measured based on a correlation between an image of the pattern projected by the projection optical system using the measurement light, and an image of the pattern projected by the projection optical system using the exposure light.

10. The method according to claim 8, wherein in the measuring step, the measurement light is set by switching to light having a median wavelength between a shortest wavelength and a longest wavelength of wavelengths used for the exposure light.

11. The method according to claim 8, wherein in the measuring step, the measurement light is set by switching to light having a shortest wavelength or a longest wavelength of wavelengths used for the exposure light.

12. The method according to claim 8, wherein in the measuring step, while switching a wavelength of the measurement light, the relative position between the original and the substrate is measured using each wavelength of the measurement light.

13. The method according to claim 8, wherein in the measuring step, switching from the wavelength of the exposure light to the wavelength of the measurement light is performed using an optical element which transmits only light having the wavelength used for the exposure light.

14. The apparatus according to claim 8, wherein in the measuring step, switching from the wavelength of the exposure light to the wavelength of the measurement light is performed using an element which shields light having a wavelength other than the wavelength of the measurement light.

15. A device manufacturing method comprising:

exposing a substrate using an exposure apparatus comprising an illumination optical system configured to illuminate an original with exposure light from an exposure light source capable of simultaneously emitting a plurality of wavelengths, a projection optical system configured to project a pattern of the original onto the substrate, and a measuring unit configured to measure a relative position between the original and the substrate via the projection optical system using the exposure light as measurement light; and developing the exposed substrate, wherein in the exposing step, the exposure apparatus exposes the substrate using the simultaneously emitted exposure light with the plurality of wavelengths upon aligning the original and the substrate based on the measurement result obtained by the measuring unit, and the measuring unit measures the relative position between the original and the substrate using the measurement light with a single wavelength which is emitted from the exposure light source.

* * * * *